United States Patent [19]

Lo

[11] Patent Number: 5,643,632

[45] Date of Patent: Jul. 1, 1997

[54] TUNGSTEN CHEMICAL VAPOR DEPOSITION PROCESS FOR SUPPRESSION OF VOLCANO FORMATION

[75] Inventor: Yung-Tsun Lo, Hsin-Chu, Taiwan

[73] Assignee: Mosel Vitelic, Inc., Taiwan

[21] Appl. No.: 543,226

[22] Filed: Oct. 13, 1995

[51] Int. Cl.⁶ .................................................. C23C 16/08
[52] U.S. Cl. .................. 427/250; 427/251; 427/253; 427/255.5; 427/255.7
[58] Field of Search .................... 427/250, 251, 427/253, 255.5, 255.7; 437/192

[56] References Cited

U.S. PATENT DOCUMENTS

| | | | |
|---|---|---|---|
| 5,328,722 | 7/1994 | Ghanayem et al. | 427/250 |
| 5,342,652 | 8/1994 | Foster et al. | 427/253 |
| 5,407,698 | 4/1995 | Emesh | 427/99 |
| 5,489,552 | 2/1996 | Merchant et al. | 437/192 |

*Primary Examiner*—Shrive Beck
*Assistant Examiner*—Timothy H. Meeks
*Attorney, Agent, or Firm*—Brumbaugh, Graves, Donohue & Raymond

[57] ABSTRACT

A two-step nucleation W-CVD process has been developed to suppress volcano formation which usually appears at W/TiN boundary. The process using different combination of spacing of W-CVD chamber between the shower head and heater and chamber pressure has been used to form an uniform nucleation layer (with uniformity of 5–6%). An uniform nucleation layer can prevent $WF_6$ penetration during W-bulk deposition. Moreover, the reaction between $WF_6$ and Ti can be suppressed. The formation of volcano at the clamp area around the wafer edge can be effectively reduced.

5 Claims, 6 Drawing Sheets

TUNGSTEN CHEMICAL VAPOR DEPOSITION PROCESS FOR SUPPRESSION OF VOLCANO FORMATION

FIELD OF THE INVENTION

The present invention relates to a process of tungsten chemical vapor deposition (W-CVD), especially to a process of W-CVD for the suppression of volcanic formation

BACKGROUND OF THE INVENTION

Use of a blanket tungsten chemical vapor deposition (W-CVD) for contact hole filling has increasingly gained attention in recent years because of its resultant superior step coverage and low resistivity in ultra large scale integration (ULSI) technology. However, the adhesion of a tungsten film to other insulating film, such as a silicon oxide film, a phosphosilicate glass (PSG) film, or a borophosphosilicate glass (BPSG) film, is extremely poor. Therefore, TiN or TiW film has been utilized as an adhesive layer to overcome this disadvantage. Relevant documents may be found in the following references: D. C. Smith, Proc. 2nd Int. Conf. IEEE VLSI 1985 (IEEE, New York, 1985) P.350; Hee-Seok Choi and Shi-Woo Rhee, J. Electrochem. Soc, 141, 475 (1994); Nathan Desatink and Brian E. Thompson, ibid., 141, 3532 (1994); Pei-lng Lee, John Cronin, and Carter Kaanta, ibid., 136, 2108 (1989); J. E. J. Schmitz, Chemical Vapor Deposition of Tungsten and Tungsten Silicides (Noyes, Ridge Park, N.J., 1992); R. V. Joshi, D. Moy, S. Brodsky, A. Charai, L. Krusin-Elbaum, P. J. Restle, T. N. Nguyen, and C. S. Oh, Appl. Phys. Lett. 54, 1672 (1989); and K. Suguro, Y. Nakasaki, S. Shima, T. Yoshii, T. Moriya, and H. Tango, J. Appl. Phys., 62, 1265 (1987).

The adhesive layer TiN is usually formed by a rapid thermal nitridation (RTN) of a sputtered Ti film, where the Ti sputter system uses a 2 mm clamp ring around the wafer edge. If a tungsten film is deposited onto this specific ring area where BPSG exists, peeling of the tungsten film usually occurs. To avoid this problem, a W-CVD chamber has been equipped with a 5 mm shadow ring. However, formation of nucleation is not totally completed under the shadow ring area. During a later step of CVD tungsten bulk deposition, the remaining $WF_{6(g)}$ penetrates the RTN-TiN barrier layer and further reacts with the underlying Ti residual, forming some cone shaped $TiFx_{(g)}$ bubbles. Hence, the volcanic formation occurs at the W/TiN boundary, causing particle contamination and device failure.

SUMMARY OF THE INVENTION

It is therefore an object for the present invention to provide a tungsten chemical vapor deposition process for suppression of volcanic formation.

The object of the present invention is fulfilled by providing a tungsten chemical vapor deposition process in a chamber having a shower head, a shadow ring and a heater. The present invention includes the following steps of: (1) depositing a first nucleation tungsten layer at a first pressure with a first gap between the shower head and the heater; (2) depositing a second nucleation tungsten layer at a second pressure higher than the first pressure with a second gap between the shower head and the heater larger than the first gap; and (3) depositing a blanket tungsten layer.

BRIEF DESCRIPTION OF THE DRAWING

The present invention will be more fully understood from the detailed description given hereinafter with reference to the accompanying drawings which are given by way of illustration only, and thus do not limit the present invention and wherein.

DETAILED DESCRIPTION OF THE PREFERRED EMBODIMENT

In the present invention, a two-step W-CVD nucleation process is proposed to suppress the volcanic formation. The invention can be best described by the following experiment.

Figure 4:
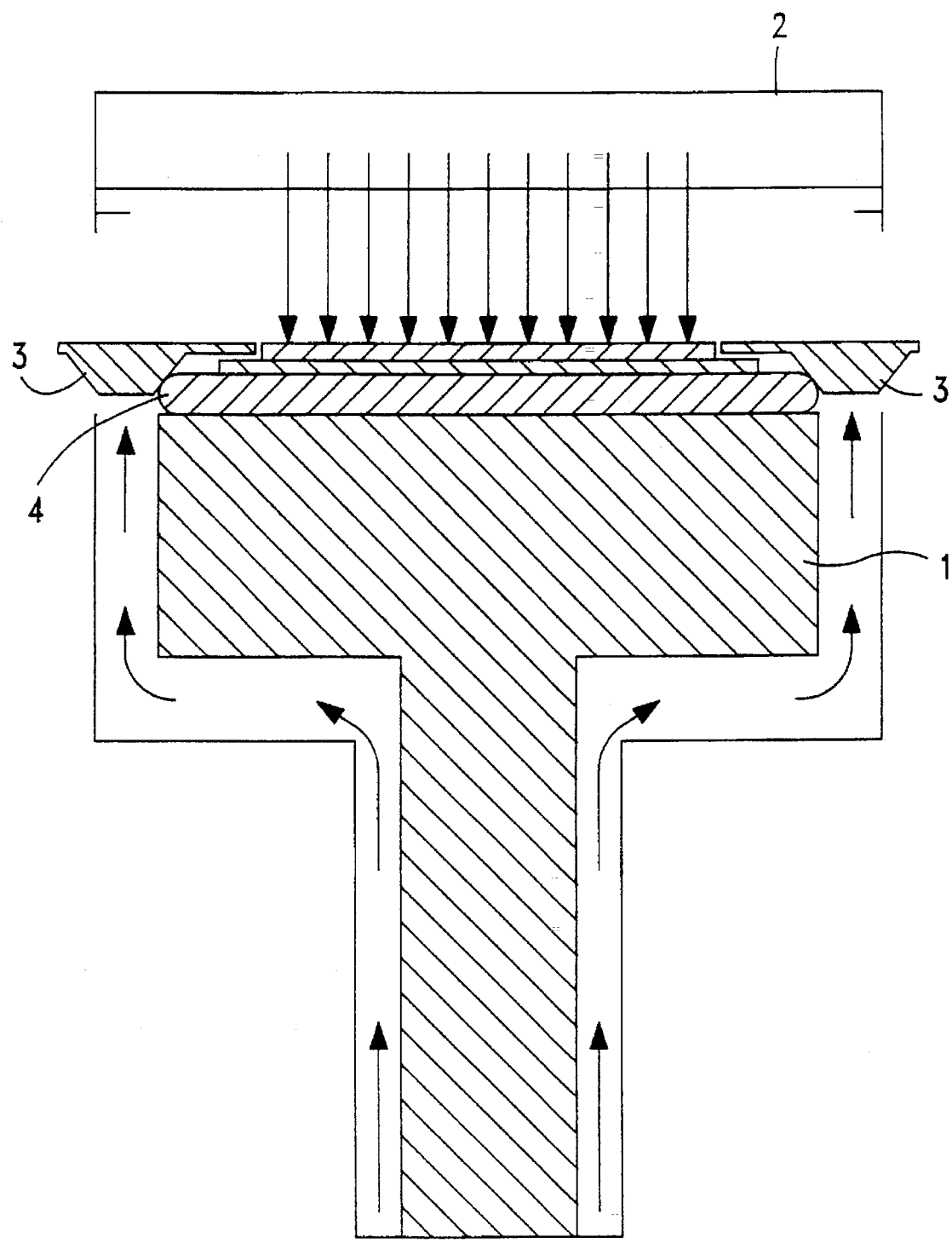
FIG. 4 shows the cross section diagram for a W-CVD chamber.

The wafer 4 in FIG. 4 is 150 mm thick and P-type. Normally, 1.8 μm deep and 0.6 μm diameter contact holes were etched on BPSG substrate. The aspect ratio of the contact hole was approximately 1:3. 1000 Å titanium was sputtered onto the wafers 4. The TiN adhesive layer was obtained by a rapid thermal nitridation (RTN) of a Ti film at 760° C. for 30 seconds in $N_2$. Finally, an 8000 Å blanket tungsten film was formed on the wafers 4 by a two-step W-CVD process conducted in a cold wall, single-wafer CVD system. For the W-CVD of the present invention, the chamber pressure during nucleation was 4.5 torr and 10 torr, and the spacing between shower head 2 and heater 1 was 400 mil and 560 mil respectively in the first step and the second step. The deposition temperature was 465° C. The first step nucleation was immediately followed by the second step. The process parameters for the two-step tungsten nucleation are listed in Table 1.

TABLE 1

| Two-step tungsten nucleation parameters | | |
|---|---|---|
| | 1st step | 2nd step |
| Nucleation temp. | 465° C. | 465° C. |
| Nucleation pressure | 4.5 torr | 10 torr |
| $SiH_4/WF_6/H_2$ gas flow ratio | 5/10/1000 | 5/10/1000 |

The sheet resistance were measured using a four-point probe. Junction leakage current was measured by an HP 4145 equipment. Volcanic formation and step coverage were observed using a scanning electron microscopy (SEM). Finally, chemical composition of the TiN film was analyzed by an Auger electron spectrometry (AES).

Figure 1:
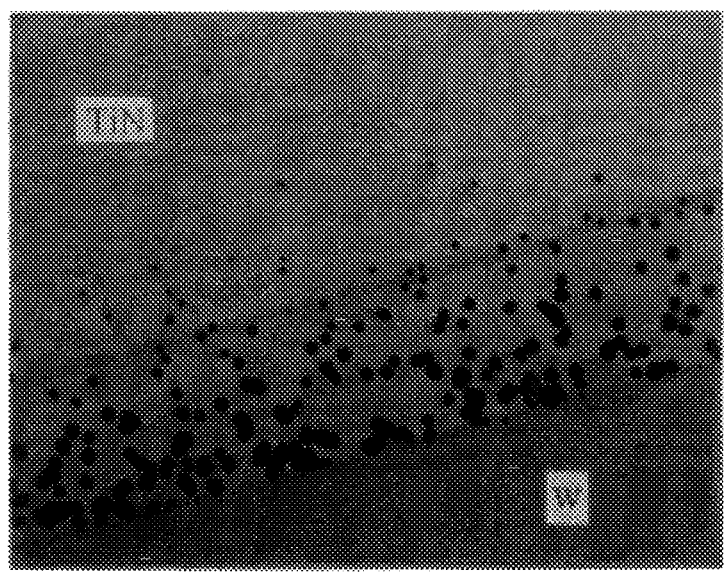
FIG. 1 shows the top view micrograph of volcanic formation at the W/TiN boundary.
Figure 2:
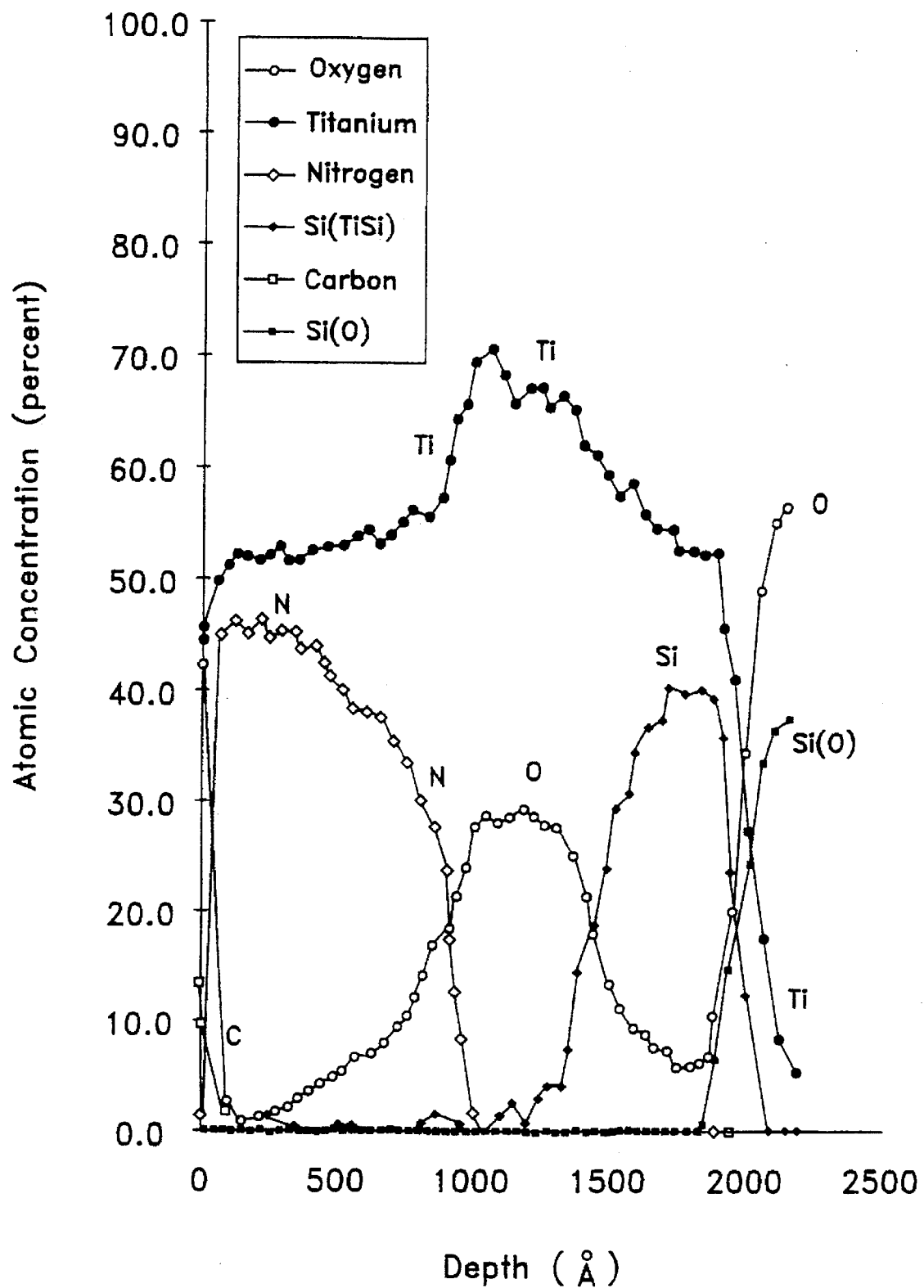
FIG. 2 shows the AES depth profile of a 1000 Å sputtered Ti film after RTN at 760° C. for 30 seconds in $N_2$.

After depositing the CVD tungsten film onto the RTN-TiN adhesive layer, formation of volcanoes was found along the wafer edge about 5 mm in width, near the boundary of the TiN formatted area and the tungsten deposition area. As shown in FIG. 1, many black volcano points found near the boundary of the W and TiN cause tungsten film peeling and hence the particle contamination. During depositing CVD tungsten, since formation of the nucleation site is not completed under the shadow ring area, the remaining $WF_6$ penetrates the RTN-TiN barrier layer and further reacts with the underlying Ti residual forming some $TiFx_{(g)}$ bubbles. Therefore, the volcanic formation occurs at the W/TiN boundary. The chemical composition for 1000 Å Ti on $SiO_2$ after RTN at 760° C. for 30 sec in $N_2$ was measured by AES. As shown in FIG. 2, 800 Å TiN, 600 Å TiO/Ti, and 400 Å $TiSi_2$ were observed. It is with noting that the Ti residual still exists under the RTN-TiN film. The volcano growth is due to the incomplete formation of nucleation under the W-CVD shadow ring area which has a strong effect on the growth site for the subsequent tungsten film.

Figure 3A:
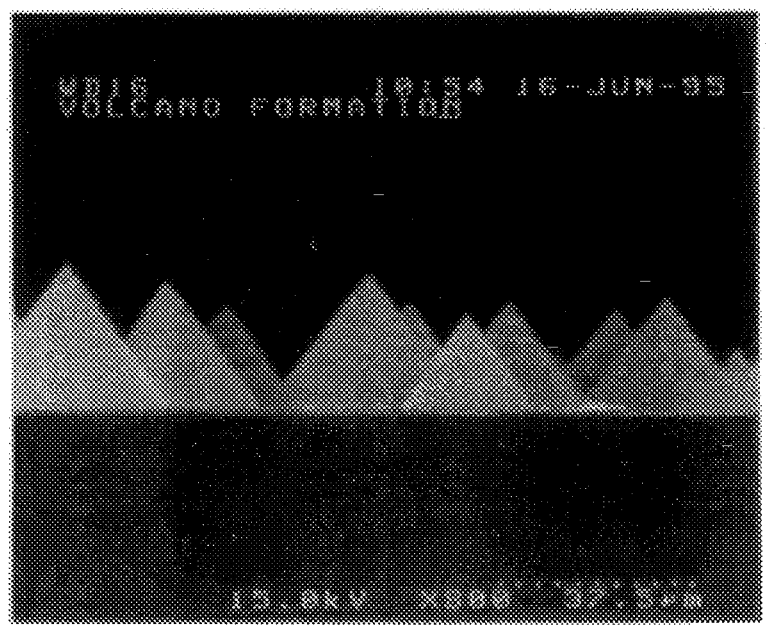
FIG. 3a shows the morphology of some pyramid-shaped volcanoes.
Figure 3B:
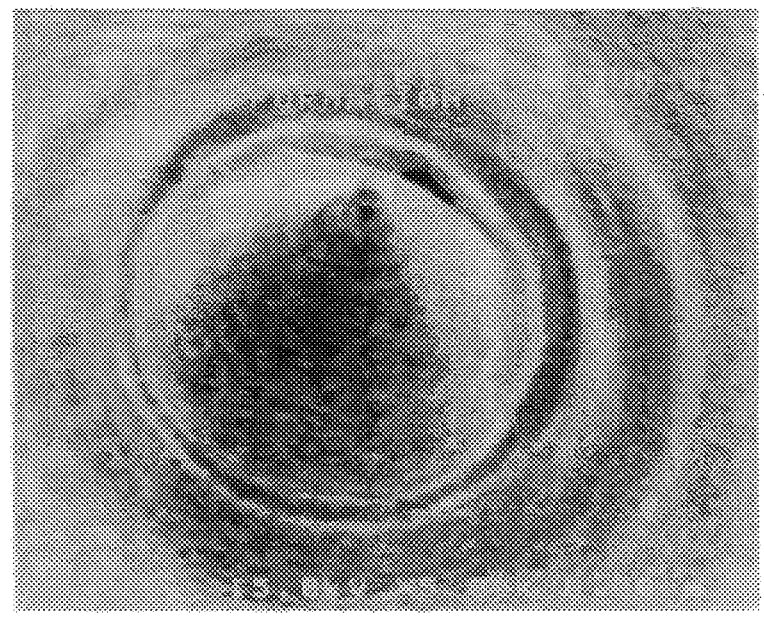
FIG. 3b shows a 60° tilted cone-shaped volcano.
Figure 3C:
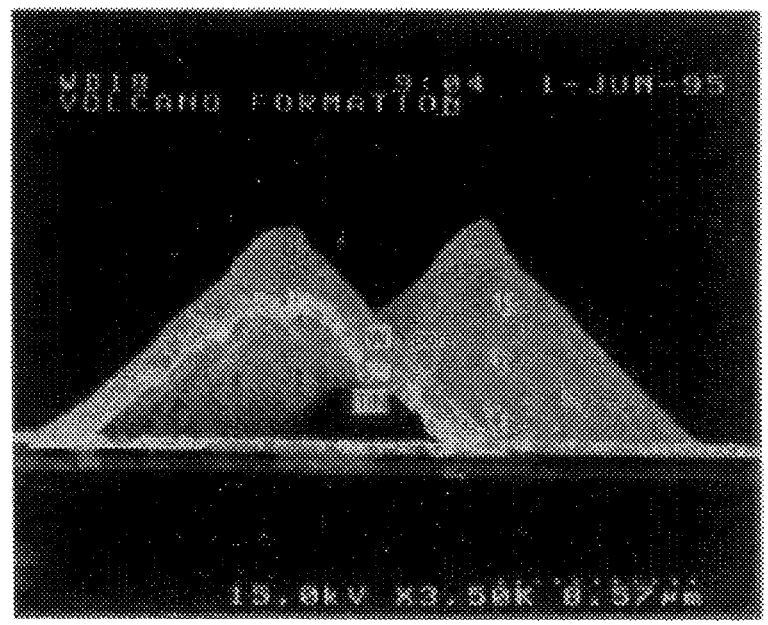
FIG. 3c shows the TiN-W film with pores.

SEM micrographs of volcanoes are shown in FIGS. 3a to 3c. Obviously, the volcanoes are pyramidal or cone-shaped, and their diameter can be as large as 10 μm to 20 μm. The formation of the cone-shaped volcano is due to the highly (111) preferential orientation of the TiN layer, as disclosed by C. Y. Ting in J. Vac. Sci. Technol., 21, 14 (1982). Moreover, the unreacted $WF_6$ gas penetrates the TiN film and further reacts with the residual Ti. Since the interaction produces TiFx gas, the local TiN film is raised by the TiFx gas the pyramid-like volcano is developed. As shown in FIG. 3c, some pores were further observed on the pyramid surface, which is probably due to the break-through of TiN-W films by TiFx gas.

Clearly, formation of the volcano is due to the incomplete formation of nucleation layer under the shadow ring area. Therefore, the nucleation layer grown on the clamp area is the main point to suppress the volcanic formation. In this embodiment, the gap between the shadow ring 3 and wafer 4, as shown in FIG. 4, was reduced to form a uniform nucleation layer on the clamp area. Moreover, high pressure is used to help reactive gas flow outward. In a conventional W-CVD system with the wafer edge clamped by shadow ring 3, the reactive gas could not fully react under the clamped region because no gap exists.

Nucleation steps with 600 mil spacing at various pressures were performed. The results are shown in Table 2. Nucleation at 10 torr can reduce the volcanic formation. When the nucleation pressure was increased to 20 torr, the volcanic formation was further improved. However, even with nucleation at 4.5 torr, 6 torr or 8 torr, volcano formation in the clamp area still exists. Moreover, these samples have non-uniform problems (>20%). To improve the uniformity, a two-step nucleation process is performed at 4.5 torr and 10 torr respectively. Since a higher pressure, e.g. 10 torr, will attack the topographic region under the clamp area, a lower pressure, e.g. 4.5 torr, is used in the initial nucleation process.

TABLE 2

Nucleation at the spacing 600 mil of shower head and heater

| W/N | Pressure (torr) | Time (sec) | Rs (ohm/▩) | Uniformity (%) |
|---|---|---|---|---|
| #1 | 20 | 24 | 3.83 | 25 |
| #2 | 10 | 27 | 5.10 | 24 |
| #3 | 8 | 24 | 6.10 | 25 |
| #4 | 6 | 27 | 7.24 | 22 |
| #5 | 4.5 | 30 | 7.20 | 15.5 |

The sheet resistance for the two-step nucleation process at 4.5 torr/400 mil and 10 torr/600 mil was 4 ohm/▩ to 6 ohm/▩ with a suitable nucleation layer thickness of 400 Å to 500 Å. If the nucleation layer is too thick, the step coverage of subsequent bulk deposition will become worse.

However, the deviation of uniformity remained too large, due to the large spacing between shower head 2 and heater 1. As shown in Table 3, nucleation at 4.5 torr/400 mil and 10 torr/560 mil resulted in good uniformity (6%–8%). Moreover, volcanic formation around the wafer edge was effectively suppressed after bulk deposition. Due to the gap that existed between shower head 2 and heater 1, a stronger nucleation layer on the clamp area was provided during the second nucleation step at 560 mil. Good uniformity of the nucleation layer was observed but volcanic formation existed on the clamp area. During nucleation (at 400 mil and 500 mil), since the wafer 4 was touched to the clamp 3, the formation of nucleation sites was not totally completed under the clamp region.

TABLE 3

The nucleation step was separated into two steps.
(4.5 torr/400 mil and 10 torr/560 mil)

| W/N | 1st step 400 mil (4.5 torr) | 2nd step 560 mil (10 torr) | Rs (ohm/▩) | Uniformity (%) |
|---|---|---|---|---|
| #10 | 12 sec | 12 sec | 4.83 | 6.4 |
| #11 | 15 sec | 15 sec | 4.28 | 5.8 |
| #12 | 8 sec | 15 sec | 5.06 | 8.9 |

Figure 5:
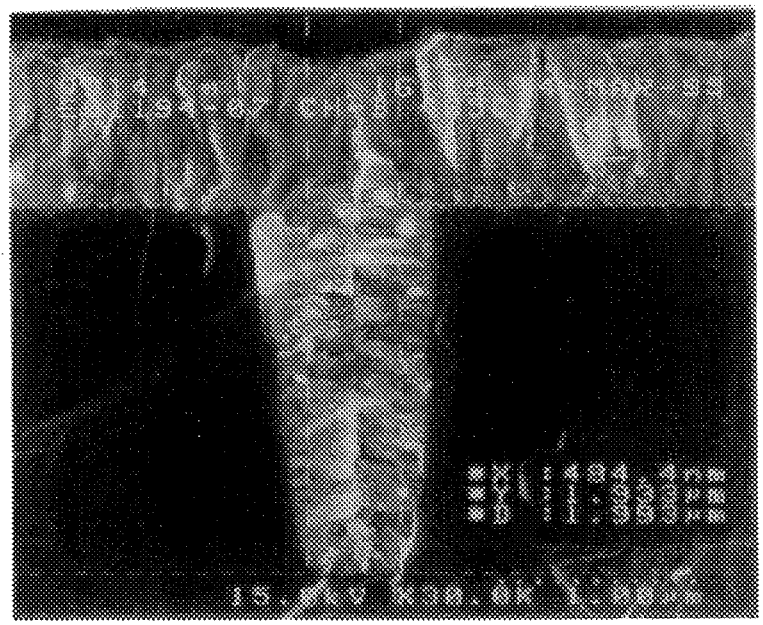
FIG. 5 shows a contact hole by the process according to the present invention.
Figure 6A:
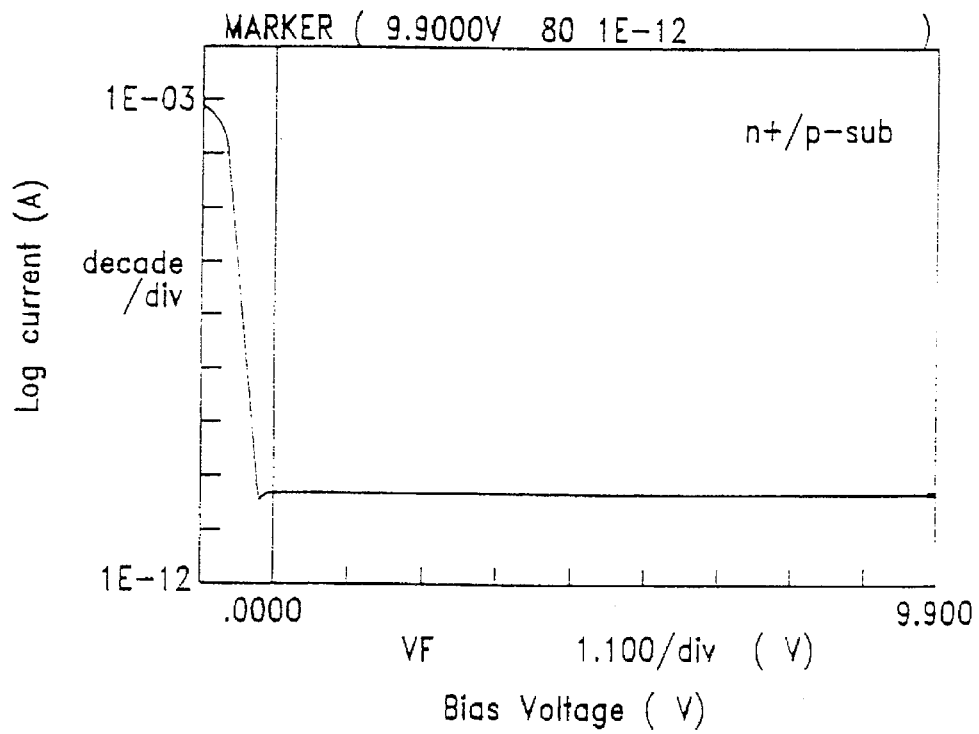
FIG. 6 shows junction leakage current characteristic of the contact hole in both $n^+$ and $p^+$ diffusion layers.
Figure 6B:
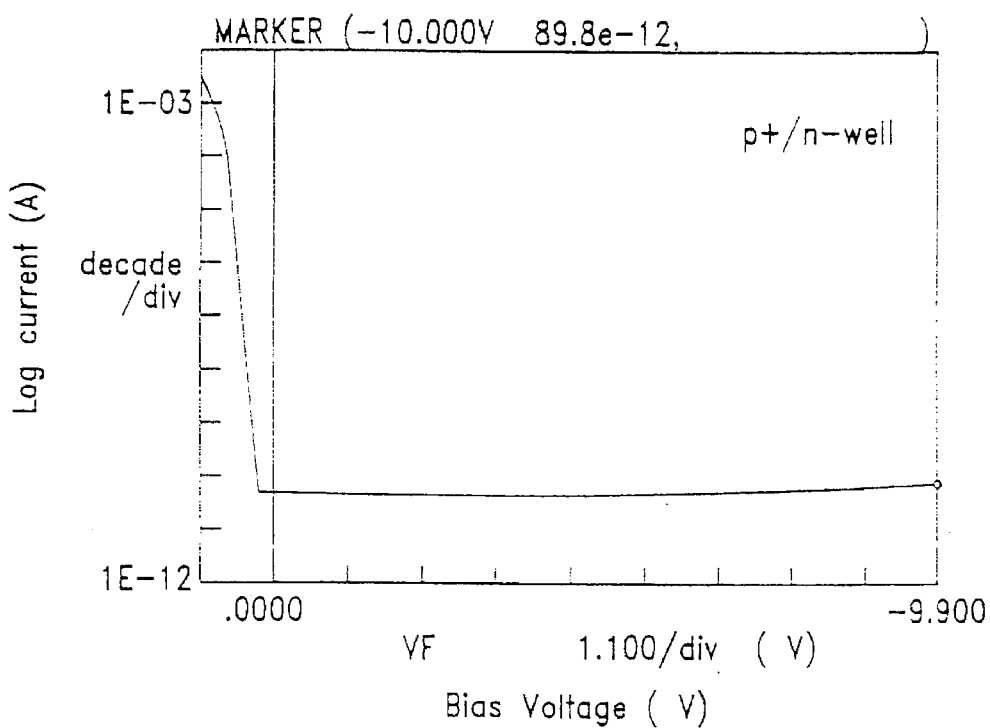

Accordingly, the two-step nucleation process (4.5 torr/ 400 mil and 10 torr/560 mil) provides a more uniform nucleation layer, which can prevent $WF_6$ from penetration during W-bulk deposition. As shown in FIG. 5, a contact hole with excellent step coverage and void-free can be obtained. The formed film has a thickness of 7630 Å, a stress of $1.01 \times 10^{10}$ dyne/cm² tensile, a reflectivity versus bare si at 480 nm of 46%, and a uniformity of sheet resistance of 0.77%. The junction leakage current measurements were employed to further confirm the formed W-CVD contact characteristics. FIG. 6 shows the reverse current-voltage characteristic in $n^+$ and $p^+$ diffusion layers. The contact having a diameter of 0.6 μm is formed by a RTN of 1000 Å Ti, and an 8000 Å-thick blanket tungsten filling process, in which the leakage currents are less than $1 \times 10^{-10}$ ampere in both $n^+/p$ and $p^+/n$ junctions. These I–V results indicate that the process according to the present invention is very useful in tungsten plug application.

As discussed above, the two-step W-CVD process according to the present invention is useful in suppressing the volcano formation. The experimental results have shown that the formation of volcano at the clamp area around the wafer edge can be effectively reduced. Thus, the particle contamination can be avoided, and the yield can be improved.

While the invention has been described by way of examples and in terms of several preferred embodiments, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A process for tungsten chemical vapor deposition on a wafer performed in a chamber having a shower head, a shadow ring and a heater, wherein said wafer is supported by said heater, said shadow ring is positioned over the edge of said wafer, said shower head is positioned over said shadow ring, said wafer and said heater, and wherein said shower head supplies a source of tungsten, said process comprising the following steps of:

depositing a first nucleation tungsten layer on said wafer at a first pressure under conditions whereby there is a first gap between the shower head and the heater;

depositing a second nucleation tungsten layer on said first nucleation tungsten layer at a second pressure higher than the first pressure under conditions whereby there is a second gap between the shower head and the heater larger than the first gap; and depositing a blanket tungsten layer on said second nucleation tungsten layer.

2. A process as claimed in claim 1, wherein the first pressure is about 4.5 torr.

3. A process as claimed in claim 1, wherein the second pressure is about 10 torr.

4. A process as claimed in claim 1, wherein the first gap is about 400 mil.

5. A process as claimed in claim 1, wherein the second gap is about 560 mil.

* * * * *